(12) United States Patent
De Ambroggi et al.

(10) Patent No.: US 6,473,339 B2
(45) Date of Patent: Oct. 29, 2002

(54) REDUNDANCY ARCHITECTURE FOR AN INTERLEAVED MEMORY

(75) Inventors: Luca Giuseppe De Ambroggi, Catania; Fabrizio Campanale, Bari; Salvatore Nicosia, Palermo; Francesco Tomaiuolo, Monte Sant' Angelo; Promod Kumar, Motta S. Anastasia, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 51 days.

(21) Appl. No.: 09/773,272

(22) Filed: Jan. 31, 2001

(65) Prior Publication Data

US 2001/0026476 A1 Oct. 4, 2001

(30) Foreign Application Priority Data

Mar. 2, 2000 (EP) ............................................. 00830158

(51) Int. Cl.[7] ................................................. G11C 7/00
(52) U.S. Cl. ............. 365/185.09; 365/200; 365/230.01; 365/230.04; 365/230.06; 365/231; 365/238.5
(58) Field of Search ...................... 365/185.09, 230.01, 365/200, 230.04, 230.06, 231, 238.5

(56) References Cited

U.S. PATENT DOCUMENTS

| | | | |
|---|---|---|---|
| 5,559,990 A | 9/1996 | Cheng et al. | ................. 395/484 |
| 5,596,539 A | 1/1997 | Passow et al. | ............... 365/210 |
| 5,696,917 A | 12/1997 | Mills et al. | ................... 395/401 |
| 5,831,393 A | * 11/1998 | Hohenstein et al. | ... 395/185.05 |
| 5,966,724 A | 10/1999 | Ryan | ........................... 711/105 |
| 2001/0026476 A1 | * 10/2001 | De Ambroggi et al. | . 365/189.09 |

FOREIGN PATENT DOCUMENTS

| | | | |
|---|---|---|---|
| EP | 0561370 | 9/1993 | ............. G11C/7/00 |
| EP | 0961283 | 12/1999 | ............. G11C/7/00 |
| JP | 2001236794 A | * 8/2001 | |

* cited by examiner

Primary Examiner—Viet Q. Nguyen
(74) Attorney, Agent, or Firm—Lisa K. Jorgenson; Allen, Dyer, Doppelt, Milbrath & Gilchrist, P.A.

(57) ABSTRACT

A redundancy architecture for a memory includes an array of memory cells divided into at least a pair of semi-arrays that are singularly addressable. Each semi-array is organized into rows and columns. The redundancy architecture includes a number of packets each including redundancy columns. The packets are divided into two subsets of packets. Each packet is addressable independently from the other by respective address circuits. Each packet also provides redundancy columns exclusively for a respective semi-array.

26 Claims, 4 Drawing Sheets

REDUNDANCY ARCHITECTURE FOR AN INTERLEAVED MEMORY

FIELD OF THE INVENTION

The present invention relates to memory redundancy architectures, and in particular, to an architecture for burst interleaved memories.

BACKGROUND OF THE INVENTION

Redundancy is a hardware technique that allows the recovering of eventual defects of a memory array to increase the effective yield of the fabrication process of the device. In most cases, when speaking of redundancy a "column" redundancy is generally intended. Matrix columns containing one or more defects are substituted with spare or redundant columns.

The commonly used architecture for managing the addresses of redundant locations is mainly formed by banks of non-volatile memory units, which are referred to as CAM herein. Each CAM can be programmed and erased by the manufacturer during a phase of testing of the devices. These CAMs store information suitable to identify the memory location to be substituted.

Different kinds of information can be stored in a CAM. Information includes addresses of the location to be repaired, which packet of bit of an addressed word must be replaced, whether or not the bank of the CAM is used to store a failed address, etc.

The function of a redundancy managing architecture is to verify whether or not the failed addressed location is among the redundant ones, and in case of a positive result, to activate the redundant columns and at the same time to deactivate the decoding of the defective location of the matrix. This must be done for any operation, reading or writing, that implies addressing the defective or failed location.

The number of CAMs used in a redundancy architecture sets the maximum number of packets (columns, byte, rows . . . ) of the whole array of memory cells that can be redundant or substituted. In a traditional functioning of a standard (asynchronous) memory, there are no particular difficulties in dedicating a redundancy packet to any failed column of the memory, nor are there any restrictions on activation times of any redundant element. In contrast, in the case of synchronous memories operating with a burst interleaved protocol, there is the need of properly differentiating the activation instants for contiguous redundant locations during burst read cycles.

In fact, in a burst interleaved access mode, two contiguous readings (e.g., add0→add1) are carried out with a certain time overlap. This means that, while data is being output, the successive data has been already addressed and is in the process of being read. Therefore, it is clear that redundancy architectures for this kind of interleaved memories must consider this peculiarity in order to differentiate correctly without conflicts, the turn-on instant of the redundancy elements. For example, two contiguous locations that are both redundant may be addressed according to a burst access mode.

Normally the redundancy architecture is similar to the corresponding decoding structure of the memory matrix. Similarly, by referring to the architecture of a typical matrix, the redundancy unit is formed, as depicted in FIG. 1, by a main bit line (MBL) (defined in Metal2), starting from which, four real bit lines (defined in Metal1) that are connected to the drains of the respective redundancy cells, are decoded.

To form a column redundancy, two alternative approaches are normally followed. A first approach is redundancy at the output, i.e., replacement of the single line to which the fail belongs. A second approach is redundancy by packets, which is a full or partial substitution of the group of bit lines of the word affected by a fail, as addressed during a reading.

For example, the redundancy architecture may contemplate the repairing of an 8-bit packet (i.e., of the byte high or of the byte low) of an addressed 16-bit word, irrespectively of the fact that the defect can be verified on a single bit of one of the bytes and not on all the 8-bits.

According to this second approach, there is a waste of area due to the superfluous number of columns that in the majority of repairings of single bit failures would not be necessary. On the other hand, a greatly simplified circuitry for managing the redundancy is required. This reduces the silicon area of integration of the managing circuitry. For example, there may be four redundancy banks for the whole array, i.e., the possibility of using four column packets for eventual replacements.

In an interleaved memory, the whole array of cells is split in several parts (typically in two semi-arrays EVEN/ODD) that are singularly addressable to avoid problems in managing two partly time overlapped readings as previously discussed. The number of sense amplifiers are equal to the number of outputs.

In a classical memory, the selection of the redundant column and the deselection of the column to be redundant is commonly done by acting on the first decoding level while the other decoding levels of the memory matrix remain active. On the contrary, the last decoding level that determines which of the bit lines connect to the MBL itself (FIG. 1) will be the selected one, and is active for both the memory matrix and the redundancy structure.

Normally, the read bus is common to both the memory matrix and the redundancy structure. So when a repaired location is addressed, the matrix local decoding is disabled while the redundancy local decoding is activated. This allows the connection between the redundant physical column and the sensing circuitry.

By implementing a redundancy per byte, only the matrix local decoding of the word to which the packet (byte) to be replaced belongs will be deactivated, while the other eight local decodings will still be selecting a matrix location. It is clear that the redundancy, which is essential to guarantee an acceptable yield of the fabrication process, has a cost in terms of silicon area consumption, and therefore, it is of great importance to optimize its performances while minimizing the area dedicated to it.

SUMMARY OF THE INVENTION

It has been found that great advantages can be attained by subdividing the number of redundancy column packets in subgroups, each one addressable independently from the other subgroups and providing columns of redundancy cells only for a respective bank in which the memory cell array is divided. Each subgroup of packets of redundancy columns has a capacity appropriate to satisfy statistically determined needs of possible bit failure of the single bank to which the subgroup is associated.

The redundancy selection circuitry, or the number of banks of CAMs, remains unchanged because nothing else is modified. In practice, the total number of packets of redundancy columns is simply split, i.e., subdivided into subgroups. This arrangement proves itself extremely advantageous. It simplifies the managing of the redundancy and determines a saving of silicon area.

In particular, the approach of the invention does not impose any restriction despite the fact that it is no longer possible to substitute (redundant) two bytes of a same addressed location (word). On the other hand, the condition of independence of redundancy for the banks of subdivision of an interleaved memory is fully accomplished allowing, as already discussed above, the possibility of having redundant successive locations that could be read during the same time interval when accessing the memory in burst mode.

Another advantage of the subdivision of the redundancy architectures in distinct subgroups includes the fact that in terms of layout, the amplitude of the read and write buses for a memory organized in 16-bit words can be 16 bits only along the whole width of the physical memory array because the buses to which the redundant MBL will be eventually connected will be local and related to a single bank (in the case of an interleaved memory) and to a single read/write path.

For the same design choice of redundancy by bytes, a commonly used technique to save area includes using separately the four right columns and the four left columns of a packet of eight columns, thus dividing in two portions a full packet of redundancy columns.

However, this known technique has the following drawbacks. It is impossible to have two successive redundant locations according to the burst-interleaved reading mode, because it is not possible to activate at the same time 16 main bit lines related to two redundant bytes of the two successive locations (EVEN-ODD) during the same reading cycle. Another drawback is the difficulty in routing the read/write bus that must have a 32-bit width for the whole width of the array of memory cells, because redundancy of all the banks using the same elements (spare packets of columns) must be ensured.

According to another aspect of the invention, a number of banks of non-volatile registers (CAM) equal to the maximum number of substitutions that must be ensured, defined during the design of the device, associate to each bank of subdivision of the cells of the whole memory array (typically two semi-arrays of an interleaved memory) a number of redundancy packets. This number is equal to a pre-defined number of banks of non-volatile registers (CAM).

For each of the two address systems relative to the subdivision banks of the memory array, for example, relative to the EVEN semi-array and to the ODD semi-array of an interleaved memory, suitable XOR structures and one or more non-volatile registers are used for selecting the semi-array affected by defects. One or more structures of non-volatile registers thus selecting the portion of an addressed word must be substituted.

This approach allows a reduction (a halving, in the case of a two bank interleaved memory) of the required number of non-volatile registers with a consequent silicon area saving. Moreover, this architecture for managing the redundancy has great flexibility. In fact, the redundancy resources can be freely assigned to any subdivided bank of the array and in any combination and/or ratio.

Essentially, according to the present invention, a double XOR structure for generating the HIT signals and a CAM dedicated to the storage of the most significant column address used as a multiplexing signal of the HIT signal towards the correct portion of the array, for example, towards the EVEN bank or towards the ODD bank of a common interleaved memory subdivided in two semi-arrays, are used.

DETAILED DESCRIPTION OF THE PREFERRED EMBODIMENTS

The reading (as well as any writing cycle) of a memory location, whether it is a standard asynchronous memory (with random access) or a synchronous memory (with burst access), always begins with the assigning of an address by the user or by an internal dedicated circuitry.

The decoding circuitry decodes the assigned address to identify the location of interest and allows either a read or a write operation. If the device has been made redundant during its testing at the end of fabrication, more steps are required to identify the real physical location of the memory.

Figure 1:
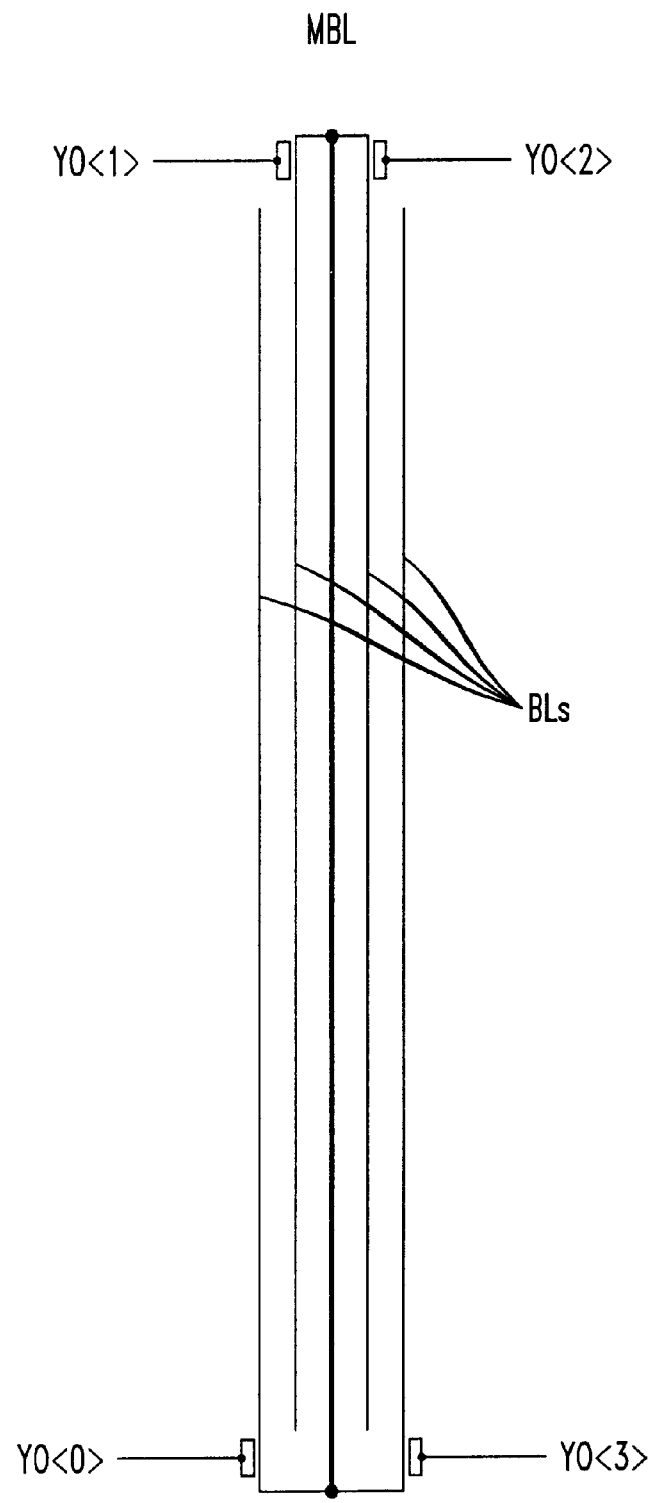
FIG. 1 shows a packet of redundancy columns composed of a main bit line from which four real bit lines are connected to the drain of respective redundancy memory cells according to the prior art.
Figure 2:
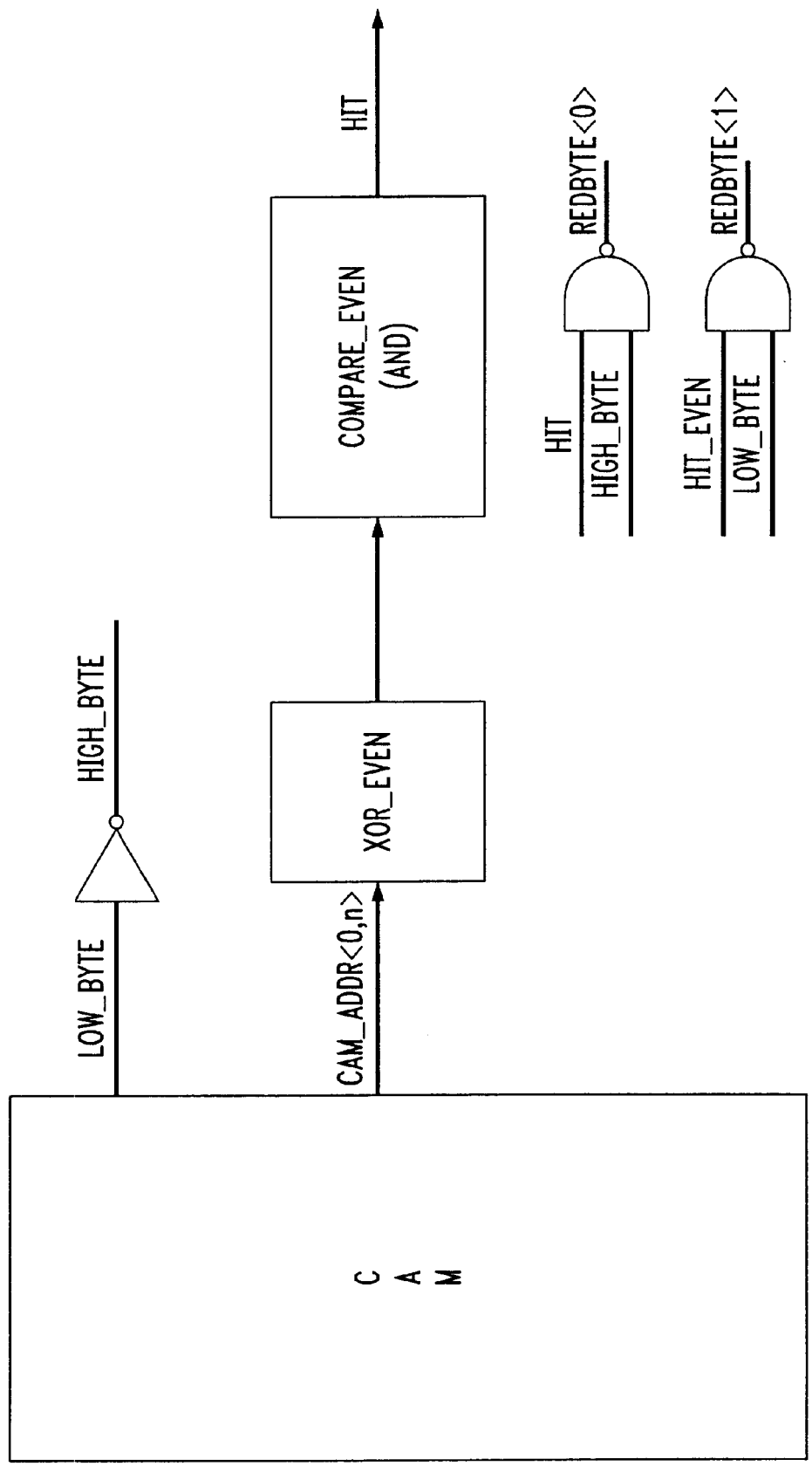
FIG. 2 is a functional block diagram of a non-volatile memory unit (CAM) dedicated to the storage of the most significant column address, and of the related multiplexing circuitry for directing the HIT signal towards the correct portion of the memory array according to the present invention.

Referring now to FIG. 2, the assigned address is XOR combined with the addresses of the redundant locations, and if it corresponds to one of them, a HIT signal is generated that activates the redundancy circuitry substituting the packet of columns containing the failed memory cell with the packet of redundant columns.

Figure 4:
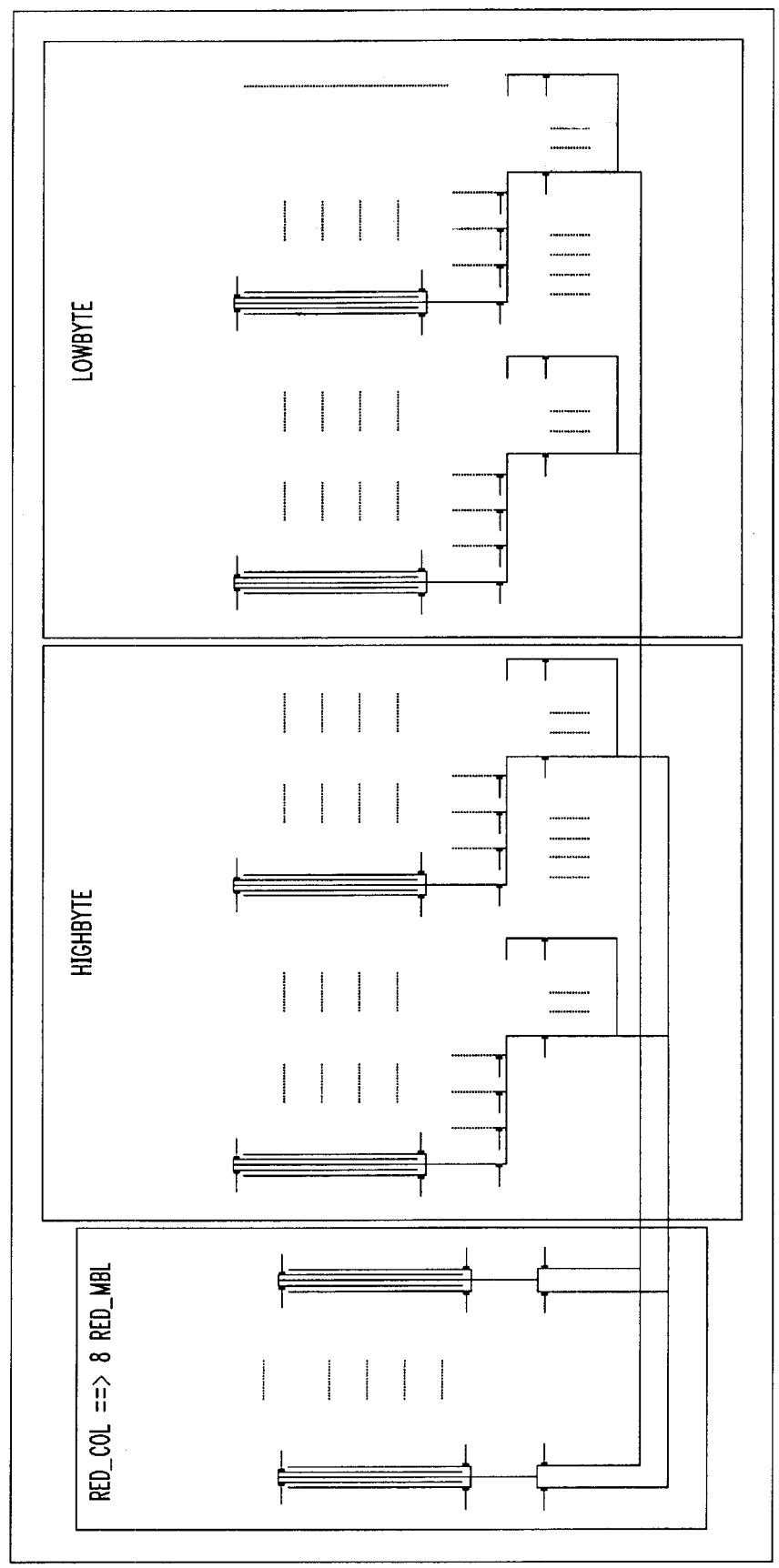
FIG. 4 is a diagram of the redundancy process for the case of a burst interleaved memory according to the present invention.

In the case considered for redundancy by packets of columns (byte), the generated HIT signal is multiplexed in order to replace the correct packet (byte) of the addressed word. In the considered example, although the reading is carried out by words, the redundancy is activated by substituting packets of eight columns, according to the diagram depicted in FIG. 4.

Figure 3:
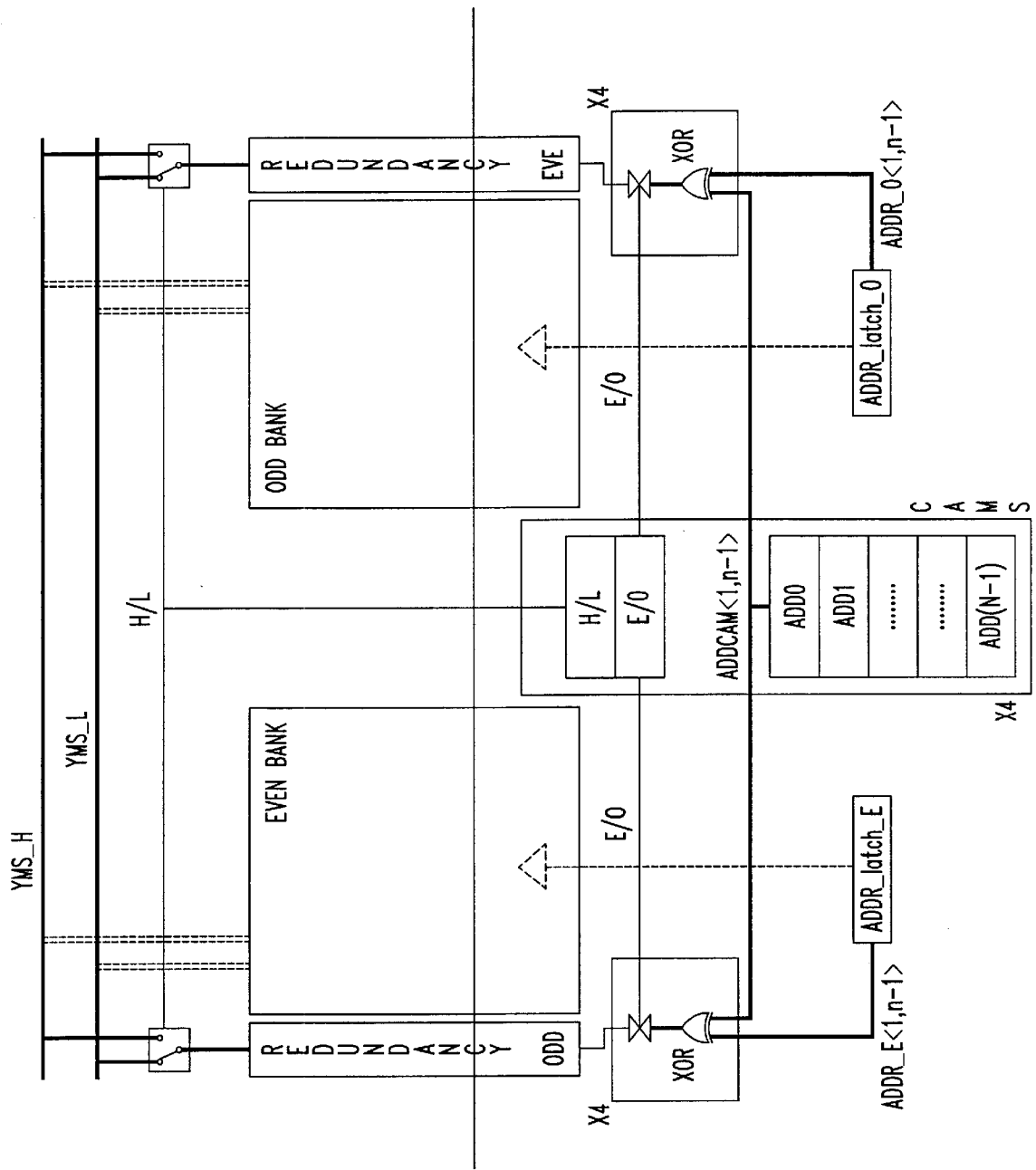
FIG. 3 is an embodiment of the invention for a burst interleaved memory that is divided into two semi-arrays EVEN and ODD according to the present invention.

Successively, the effective activation of the redundancy occurs at the decoding level where the signal $HIT_{13}$ lowbyte/ $HIT_{13}$ highbyte are generated, activates the YMR redundancy decoding, and disables the column decoding in the main semi-array ($YM_{13}$ lowbyte/ $YM_{13}$ highbyte), as schematically depicted in FIG. 3. The read bus, as well as the Program Load, relative to the failed byte, are connected to the redundant columns corresponding to the columns of the semi-array containing a failed memory cell.

By referring to the diagram of FIG. 3, the use of a double XOR structure to generate the HIT signals and the introduction of a CAM for storing the most significant column address that is used for multiplexing the HIT signals towards the correct semi-arrays (EVEN or ODD) guarantees an independent redundancy for the two semi-arrays EVEN/ODD of the (interleaved) memory. This fully satisfies the requirements imposed for the overlap of the readings.

In standard memories, the managing of the redundancy includes comparing all column addresses with the values stored in the CAMs of the redundancy banks. A logic AND of the single bits of the result of such a comparison produces the HIT signal that, depending on the other essential information (High$_{13}$ Byte/Low$_{13}$ Byte) stored in another CAM, activates the redundancy circuitry relative to the byte that needs to be substituted.

In the case of the considered burst interleaved memory, only n−1 column address, instead of n, stored in the respective CAMs are used to produce the HIT signal by a logic XOR operation. In fact, also the most significant address (A0) is stored in a CAM, but its function is that of multiplexing the produced HIT towards the correct semi-array. The n−1 addresses point to two symmetrical locations, one for each semi-arrays EVEN/ODD, while the n-th address A0 serves for selecting between the two symmetrical locations.

Successively the two XOR structures are input with the addresses stored in the CAMs and differ from each other because of the other input that the address bus EVEN or ODD presents to the input structures (address latch). As a consequence, the redundancy value is also kept unchanged for the entire duration of the reading of a semi-array. This is because the information of the address latches remains unchanged during the entire duration of a reading, independently from the fact that either the EVEN or ODD semi-array may be considered, depending on the content of the CAM even$_{13}$ matrix/odd__matrix that stores the address A0.

These considerations are valid for each of the redundancy banks that are present (4). This implies that, even if in different redundancy banks, it is possible to substitute the same location pointed by the n−1 addresses in both semi-arrays. It is sufficient to store in the two banks the same n−1 addresses only varying the content of the CAM odd/even$_{13}$ matrix corresponding to the most significant address A0.

That which is claimed is:

1. An interleaved memory comprising:
   an array of memory cells divided into a pair of semi-arrays each being singularly addressable and each being organized into rows and columns;
   address circuits for addressing said pair of semi-arrays; and
   at least one redundancy packet comprising a plurality of redundancy columns, said at least one redundancy packet being divided into two subsets of redundancy packets and each one being addressable independently from the other by respective address circuits for providing redundancy columns exclusively for one of said pair of semi-arrays.

2. An interleaved memory according to claim 1, further comprising a plurality of non-volatile memory units containing addresses pointing to symmetrical locations in said pair of semi-arrays where damaged memory cells are to be substituted, and wherein one of said plurality of non-volatile memory units stores a most significant bit of a column address pointing to one of said pair of semi-arrays having a damaged memory cell.

3. An interleaved memory according to claim 2, wherein each address circuit comprises:
   an XOR logic gate for each subset of redundancy packets associated with a semi-array for comparing an address directed to one of said pair of semi-arrays with the addresses pointing to the symmetrical locations of redundant columns in said pair of semi-arrays stored in said plurality of nonvolatile memory units; and
   a selection switch connected to said XOR logic gate and being configured by said non-volatile memory unit storing the most significant bit of the column address pointing to one of said pair of semi-arrays having the damaged memory cell, said selection switch for directing an enable signal to the subset of redundancy packet relative to the one of said pair of semi-arrays having the damaged memory cell.

4. An interleaved memory according to claim 2, further comprising:
   a bus comprising a high-byte bus and a low-byte bus being alternately connected to said pair of semi-arrays with the damaged memory cell being associated with one of said high-byte and low byte busses; and
   a multiplexer for multiplexing an output of each of said two subsets of redundancy packets based upon said non-volatile memory unit storing the most significant bit for coupling the output of an addressed subset of a redundancy packet to said high-byte bus or said low-byte bus relative to output lines containing the damaged memory cell.

5. An interleaved memory according to claim 2, wherein said non-volatile memory cells units are programmable during testing of the interleaved memory.

6. An interleaved memory according to claim 2, wherein the addresses include at least one of a read address and a write address.

7. An interleaved memory comprising:
   an array of memory cells divided into a pair of semi-arrays each being singularly addressable;
   address circuits for addressing said pair of semi-arrays;
   at least one redundancy packet comprising a plurality of redundancy columns, said at least one redundancy packet being divided into two subsets of redundancy packets and each one being addressable independently from the other by respective address circuits for providing redundancy columns exclusively for one of said pair of semi-arrays; and
   a plurality of non-volatile memory units containing addresses pointing to symmetrical locations in said pair of semi-arrays where damaged memory cells are to be substituted, one of said plurality of non-volatile memory units storing a most significant bit of a column address pointing to one of said pair of semi-arrays having a damaged memory cell.

8. An interleaved memory according to claim 7, wherein each address circuit comprises:
   a logic gate for each subset of redundancy packets associated with a semi-array for comparing an address directed to one of said pair of semi-arrays with the addresses pointing to the symmetrical locations of redundant columns in said pair of semi-arrays stored in said plurality of non-volatile memory units; and
   a selection switch connected to said logic gate and being configured by said non-volatile memory unit storing the most significant bit of the column address pointing to one of said pair of semi-arrays having the damaged memory cell, said selection switch for directing an enable signal to the subset of redundancy packet relative to the one of said pair of semi-arrays having the damaged memory cell.

9. An interleaved memory according to claim 8, wherein said logic gate comprises an XOR logic gate.

10. An interleaved memory according to claim 7, further comprising:
    a bus comprising a high-byte bus and a low-byte bus being alternately connected to said pair of semi-arrays with the damaged memory cell being associated with one of said high-byte and low byte busses; and a multiplexer for multiplexing an output of each of said two subsets of redundancy packets based upon said non-volatile memory unit storing the most significant bit for coupling the output of an addressed subset of a redundancy packet to said high-byte bus or said low-byte bus relative to output lines containing the damaged memory cell.

11. An interleaved memory according to claim 7, wherein said non-volatile memory cells units are programmable during testing of the interleaved memory.

12. An interleaved memory according to claim 7, wherein the addresses include at least one of a read address and a write address.

13. An interleaved memory comprising:

an array of memory cells divided into a pair of semi-arrays each being singularly addressable and each being organized into rows and columns;

address circuits for addressing said pair of semi-arrays; and at least one redundancy packet comprising a plurality of redundancy columns, said at least one redundancy packet being divided into two subsets of redundancy packets and each one being addressable independently from the other by respective address circuits for providing redundancy columns exclusively for one of said pair of semi-arrays;

each address circuit comprising
  a logic gate for each subset of redundancy packets associated with a semi-array for comparing an address directed to one of said pair of semi-arrays with addresses pointing to symmetrical locations of redundant columns in said pair of semi-arrays, and
  a selection switch connected to said logic gate and being configured based upon a most significant bit of a column address pointing to one of said pair of semi-arrays having a damaged memory cell, said selection switch for directing an enable signal to the subset of redundancy packet relative to the one of said pair of semi-arrays having a damaged memory cell.

14. An interleaved memory according to claim 13, wherein said logic gate comprises an XOR logic gate.

15. An interleaved memory according to claim 13, further comprising a plurality of non-volatile memory units containing the addresses pointing to the symmetrical locations in said pair of semi-arrays where damaged memory cells are to be substituted, and wherein one of said plurality of non-volatile memory units stores the most significant bit of a column address pointing to the one of said pair of semi-arrays having the damaged memory cell.

16. An interleaved memory according to claim 15, further comprising:

a bus comprising a high-byte bus and a low-byte bus being alternately connected to said pair of semi-arrays with the damaged memory cell being associated with one of said high-byte and low byte busses; and a multiplexer for multiplexing an output of each of said two subsets of redundancy packets based upon said non-volatile memory unit storing the most significant bit for coupling the output of an addressed subset of a redundancy packet to said high-byte bus or said low-byte bus relative to output lines containing the damaged memory cell.

17. An interleaved memory according to claim 15, wherein said non-volatile memory cells units are programmable during testing of the interleaved memory.

18. An interleaved memory according to claim 13, wherein the addresses include at least one of a read address and a write address.

19. A method for providing column redundancy for an interleaved memory comprising an array of memory cells divided into a pair of semi-arrays each being singularly addressable, the method comprising:

dividing at least one redundancy packet comprising a plurality of redundancy columns into two subsets of redundancy packets; and independently addressing each one of the two subsets of redundancy packets for providing redundancy columns exclusively for one of the pair of semi-arrays.

20. A method according to claim 19, further comprising accessing each semi-array using respective address circuits.

21. A method according to claim 19, further comprising storing addresses pointing to symmetrical locations in the pair of semi-arrays where damaged memory cells are to be substituted, each stored address including a most significant bit of a column address pointing to a semi-array having a damaged memory cell.

22. A method according to claim 21, wherein the addresses are stored in a plurality of non-volatile memory units.

23. A method according to claim 22, further comprising programming the non-volatile memory cells units during testing of the interleaved memory.

24. A method according to claim 21, wherein the addresses include at least one of a read address and a write address.

25. A method according to claim 21, further comprising:

comparing for each subset of redundancy packets associated with a semi-array using a logic gate an address directed to one of the pair of semi-arrays with the addresses pointing to the symmetrical locations of redundant columns in the pair of semi-arrays stored in said plurality of non-volatile memory units; and configuring a selection switch connected to the logic gate based upon the most significant bit of the column address pointing to the one of the pair of semi-arrays having the damaged memory cell, the selection switch for directing an enable signal to the subset of redundancy packets relative to the one of the pair of semi-arrays having the damaged memory cell.

26. An interleaved memory according to claim 21, further comprising:

the interleaved memory comprises a bus comprising a high-byte bus and a low-byte bus being alternately connected to the pair of semi-arrays with the damaged memory cell being associated with one of the high-byte and low byte busses; and multiplexing an output of each of the two subsets of redundancy packets based upon the most significant bit for coupling the output of an addressed subset of a redundancy packet to the high-byte bus or the low-byte bus relative to output lines containing the damaged memory cell.

* * * * *

UNITED STATES PATENT AND TRADEMARK OFFICE
CERTIFICATE OF CORRECTION

PATENT NO.   : 6,473,339 B2
DATED        : October 29, 2002
INVENTOR(S)  : De Ambroggi et al.

It is certified that error appears in the above-identified patent and that said Letters Patent is hereby corrected as shown below:

<u>Column 4,</u>
Lines 52-53, delete "$HIT_{13}lowbyte/HIT_{13}highbyte$" insert -- HIT_lowbyte/HIT_highbyte --
Line 55, delete "$YM_{13}lowbyte/YM_{13}highbyte$" insert -- YM_lowbyte/YM_highbyte --

<u>Column 5,</u>
Line 6, delete "$(High_{13}Byte/Low_{13}Byte)$" insert -- (High_Byte/Low_Byte) --
Line 27, delete "$even_{13}matrix/odd\_matrix$" insert -- even_matrix/odd_matrix --
Lines 33-34, delete "$odd/even_{13}matrix$" insert -- odd/even_matrix --

Signed and Sealed this

Twenty-second Day of July, 2003

JAMES E. ROGAN
*Director of the United States Patent and Trademark Office*